United States Patent
Slavin

(10) Patent No.: US 6,911,925 B1
(45) Date of Patent: Jun. 28, 2005

(54) LINEARITY COMPENSATION BY HARMONIC CANCELLATION

(75) Inventor: Keith R. Slavin, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/817,203

(22) Filed: Apr. 2, 2004

(51) Int. Cl.$^7$ ................................................ H03M 1/10
(52) U.S. Cl. ........................ 341/120; 341/117; 341/118
(58) Field of Search ................................ 341/120, 118, 341/117; 375/232; 381/94.8, 98; 330/10

(56) References Cited

U.S. PATENT DOCUMENTS

| | | | |
|---|---|---|---|
| 4,615,038 A | * 9/1986 | Lim et al. | 375/232 |
| 4,812,846 A | 3/1989 | Noro | |
| 5,168,526 A | * 12/1992 | Orban | 381/94.8 |
| 5,617,058 A | * 4/1997 | Adrian et al. | 330/10 |
| 5,627,899 A | * 5/1997 | Craven et al. | 381/98 |
| 6,344,810 B2 | 2/2002 | Velazquez | |
| 6,388,594 B1 | * 5/2002 | Velazquez et al. | 341/120 |
| 6,424,275 B1 | 7/2002 | Velazquez | |
| 6,570,514 B1 | 5/2003 | Velazquez | |
| 6,584,205 B1 | * 6/2003 | Croft et al. | 381/98 |

OTHER PUBLICATIONS

Croft, III et al. (U.S. patent Number 6,584,205), modulator processing for a parametric speaker system, filed on Apr. 12, 2003.*

ANALOG Devices Data Sheet for 14–Bit, 80/105 MSPS A/D Converter, AD6645 (no date).

* cited by examiner

Primary Examiner—Jean Bruner Jeanglaude
(74) Attorney, Agent, or Firm—Francis I. Gray

(57) ABSTRACT

A linearity compensation circuit provides cancellation of harmonic distortion introduced by a non-linear system into an input signal by providing a separate harmonic correction component for each harmonic of a fundamental frequency of the input signal. The harmonic correction components are summed with a delayed version of the input signal to produce a corrected input signal for input to the non-linear system. The separate harmonic correction components are generated by respective harmonic correction units, each having a programmable input filter, a Hilbert Transformer filter and a plurality of phase shifters. The output of each programmable input filter is input to the Hilbert Transformer filter and a compensating delay. The output from the Hilbert Transformer filter and the delayed version of the filtered input signal from the compensating delay are input to parallel phase shifters, and the respective outputs from the phase shifters are multiplied together to produce the separate harmonic correction component for each harmonic correction unit.

7 Claims, 3 Drawing Sheets

LINEARITY COMPENSATION BY HARMONIC CANCELLATION

BACKGROUND OF THE INVENTION

The present invention relates to linearity error correction, and more particularly to a method of linearity compensation by canceling harmonics generated in signal processing systems, such as analog-to-digital converters (ADCs).

Distortion is generated by all types of non-linear systems, i.e., systems S( ) where $$S(f(t)+g(t)) \neq S(f(t))+S(g(t))$$

where f(t) and g(t) are two signals. If an input to a non-linear system is repetitive over a certain period T, then its passage through a memory-less non-linear system is also repetitive over the same period. Fourier theory requires that:

a) all repetitive signals of period T may be expressed as a sum of a DC offset, a fundamental sine wave of period T, and the harmonics of the fundamental;

b) the fundamental and harmonics each have an amplitude and phase that is uniquely defined by the shape of the repetitive signal.

A sine frequency is the reciprocal of its period or cycle time, so the fundamental frequency is 1/T cycles per second or Hertz. A harmonic of a sine wave of period T is a frequency that is an integer multiple of the fundamental frequency so the $n^{th}$ harmonic has frequency n/T or a period of T/n.

In mathematical terms a real signal Y(t) that repeats with frequency f may be expressed as:

$$Y(t)=DC+\Sigma_{n=1 \to M}(A(n, f)\sin(2\pi n\, ft+P(n, f)))$$

A(n, f) is the amplitude of the $n^{th}$ harmonic for the fundamental frequency and P(n, f) is the corresponding phase. Also $2\pi f=\omega$ in radians/second, the unit of angular frequency, so there are $2\pi$ radians in a circle or cycle. In realizable systems the passage of high frequencies, and therefore high harmonics, is limited. For example analog systems are limited by maximum drive current capabilities and capacitive loading so in practice M does not extend to infinity. A repetitive signal may then be defined in terms of T and two finite sets of M amplitudes {A} and phase {P}.

If the fundamental frequency is applied to the non-linear system input, then the output consists of the fundamental itself and its various harmonics. As the input has no harmonics, the amplitude of each harmonic of the system output relative to the amplitude of the fundamental is a measure of its harmonic distortion. Spurious Free Dynamic Range (SFDR) is a measure of the relative size of the largest harmonic with respect to the fundamental for a defined range of pure sine-wave input frequencies. ADCs usually have a much better measured SFDR for specially complicated inputs when dither signals are added.

In some non-linear electronic devices it is possible for a time-varying input to modulate itself elsewhere in the circuit, producing harmonics directly on the output. The "fingerprint" of self-modulation of a signal is an output with very few discernible harmonics, usually very rapidly diminishing with harmonic number. This is because each harmonic n arises from the multiplication of n small signals—even the $3^{rd}$ harmonic can become insignificant. For example activity on an analog buffer/driver may affect the power supply, which in turn modulates subsequent analog signal voltages. In multi-stage pipelined analog-to-digital converters (ADCs), powerful buffers may be needed to drive multi-input flash ADCs at each stage. Also small difference signals are amplified between each stage, so the number of harmonics may relate to the number of stages.

In some cases more than one path may create a given harmonic. If the different paths are subject to different delays, than a comb response may result. This may appear as rapid changes in amplitude of the harmonic as a function of input frequency, although much less variation than with quantization distortion. Combing may make some harmonics very difficult to neutralize.

For cancellation of a self-modulated harmonic, consider an added error term consisting of a multiplication of a signal with itself:

$$Y(t)=X(t)+KX(t)^2$$

K is assumed to be small. To correct for the error term:

$$X'(t) \approx Y(t)-K'Y(t)^2$$

For K'=K, substituting Y(t) into the above equation, expanding and simplifying produces:

$$X'(t) \approx X(t)-2K^2X(t)^3-K^3X(t)^4$$

For small K the last two terms are even smaller, and the approximation is accurate. Similar arguments exist for other powers.

For exact correction of a large single harmonic due to this mechanism, the strict inverse function is obtained from the inversion of the series. To generalize for the $n^{th}$ power:

$$Y(t)=X(t)+KX(t)^n=X(t)(1+KX(t)^{n-1})$$

The correction for that power may be applied in the form:

$$X(t)=Y(t)(1-\text{Correction}(n,KY(t)^{n-1}))$$

where for the $n^{th}$ harmonic and an input p:

$$\text{Correction}(n,p)=-n\Sigma_{k=1 \to R}\{((nk-1)!(-p)^k)/(((n-1)k+1)!(k-1)!)\}$$

Convergence of this sum is guaranteed for finite integer R if:

$$|p|<(n-1)^{n-1}/n^n$$

and then $$p=KY(t)^{n-1}$$

The restriction for |p| allows K to be in the range:
ti $|K|<\{(n-1)/n|Y_{max}|\}^{n-1}(1/n)$ The Correction function for a chosen harmonic may be encoded into a correction look-up table with input p, so only an additional multiply is required. The subtraction may be combined into the look-up table or performed outside the table to minimize the size of the table.

This solution is not applicable when two or more harmonics exist unless the polynomial is factored into a more generalized form:

$$Y(t)=X(t)\Pi_{i=0 \to r}(1+K_iX(t)^{n(i)-1})$$

Each term in this product may be corrected, or factored out, by applying the above algorithms sequentially until X(t) remains. Unfortunately factorization into the simple real terms above is not always possible. The above assumes a distortion mechanism that can be corrected at each instant in time, In general this turns out not to be the case, and a different non-linear correction scheme needs to be used.

In practice analog circuits have many different distortion mechanisms, often involving modulation of the input by various small signals with delays and amplitudes that vary with frequency. Even for the single sine-wave input case, the amplitude and phase of a particular harmonic distortion with respect to the fundamental is usually a function of the input frequency, its amplitude and DC offset. An approach taken in U.S. Pat. Nos. 6,344,810, 6,424,275 and 6,570,514 assumes that each power of the input has an associated delay. The amplitude and phase of each harmonic is assumed to be a function of input frequency:

$$Y(t)=X(t)+\Sigma_{n=2 \to M}K(n,X(t))X(t+D(n,X(t)))^n$$

$D(n,X(t))$ is the time delay of the $n^{th}$ harmonic as a function of the input $X(t)$, and $K(n,X(t))$ is now, unlike K previously above, related to the amplitude of the $n^{th}$ harmonic also as a function of $X(t)$.

When measuring the phase and amplitude of the harmonics of an output of a non-linear system conforming to the above, for small $K(\ )$ the following approximation may be used to correct each harmonic:

$$X(t)=Y(t)-\Sigma_{n=2 \to M}K'(n,X(t))X(t-D'(n,X(t)))^n$$

This approximate inverse works as long as the measured function K' is close to the actual K, and D' is close to D. Considering the even harmonics, the $6^{th}$ harmonic distortion also introduces harmonics at the $4^{th}$ and $2^{nd}$ and a DC offset. In fact these harmonics are larger than the $6^{th}$ harmonic for which correction is sought. The power function above implies a harmonic profile:

$$\cos(\omega t)^6=(\tfrac{1}{64})(2\cos(6\ \omega t)+12\cos(4\ \omega t)+30\cos(2\ \omega t)+20)$$

Note that the amplitude of the $4^{th}$ harmonic is six times larger than the $6^{th}$, and the $2^{nd}$ is 15 times larger.

The even harmonics may be canceled by finding the largest even harmonic and calibrating the correct amplitude/phase to cancel it. Then find the residual harmonic in the input signal that is two lower and add in the term that also is two lower, i.e., the $4^{th}$ harmonic introduced when correcting the $6^{th}$ harmonic, while accounting for differences in their amplitude and phase. A $\cos(\omega t)^4$ term is then generated with its own amplitude/gain response to cancel this combined $4^{th}$ residual harmonic. Both the $4^{th}$ and $6^{th}$ harmonic corrections introduce $2^{nd}$ harmonics. A final squaring term cancels the result of combining these with any $2^{nd}$ harmonic distortion in the input. For any degree of harmonics this process may be applied to calibration correction until all even harmonics are canceled, and is performed over the required input frequency range. A similar method is applied to cancel each of the odd harmonics.

The frequencies used for calibration are chosen to be close enough to assume adequately smooth behavior for changes in harmonic delay and amplitude over all possible frequencies in the desired range. In general evenly spaced frequencies make the design of the delay and amplitude compensation easier. In practice once the phase, converted to delay as $D=\text{phase}/\omega$, and amplitude corrections for each harmonic are obtained, then a set of discrete Fourier Transforms (DFTs) may be used to design a set of filter coefficients for each harmonic. For properly chosen, regularly spaced calibration frequencies the set of DFTs may be efficiently implemented as a fast Fourier Transform (FFT). The filter effectively provides a function that delays the input $X(t)$ and adjusts its amplitude. Each filter is placed before its power function generator. The filter response for the $n^{th}$ harmonic is:

$$Q(n,\omega t)=P(n,X(t))X(1+D(n,X(t)))$$

raised to the power of n:

$$Q(n,\omega t)^n=P(n,X(t))^n X(1+D(n,X(t)))^n$$

The right side of this result becomes:

$$P(n,X(t))=K(n,X(t))^{1/n}$$

This represents the amplitude response required of the filtering obtained from the calibrated response $K(\ )$ if it is placed before the power function for each harmonic.

It is possible to apply the filtering directly after the power function, but in a sampled system the filter cannot then distinguish between an input frequency and the aliases of the harmonics generated by the power function that may fold back in-band. To obtain unambiguous cancellation, aliasing may severely restrict the usable input bandwidth in this case. Filtering before each power function is very much preferred, as aliased harmonics may then be canceled correctly over a large input bandwidth. In fact the aliasing mechanism may then be ignored in the filter design process, as aliased frequencies map the same way in all sampled distortion mechanisms. However the calibration algorithm does need to calculate where aliased harmonics lie so that amplitude and phase responses may be measured at the correct position in the sampled spectrum.

As part of the calibration process measured delays are translated into equivalent filter phase shifts. A phase shift is a property of the filter coefficient design, not the sample clock frequency. If the clock frequency changes after calibration, the phase shift at a frequency corresponds to a different actual delay, and compensation does not work correctly. It is important to use fixed sample rates in linearity error compensation systems. The complexity of interaction between harmonics in this calibration process makes precise harmonic cancellation difficult when higher order harmonics are involved, as the filters need to be more precise to ensure that accurate cancellation occurs. Precise calibration may be more difficult if noise, quantization distortion or self-aliasing comb-filtering effects In ADCs are present.

In real systems mechanisms for generating harmonics may be very complex—no single mechanism may be responsible. Therefore a harmonic correction mechanism may only work correctly for single sine-wave inputs. More complicated inputs introduce intermodulatlon distortion:

$$(\sin(\omega_1 t)+\sin(\omega_2 t))^2=1-(\tfrac{1}{2})\cos(2\ \omega_1 t)-(\tfrac{1}{2})\cos(2\ \omega_2 t)+\cos((\omega_1-\omega_2)t)-\cos((\omega_1+\omega_2)t)$$

The first two non-DC terms on the right are expected when squaring each term separately, but the last two terms result in sum and difference frequencies. If the model of powers-with-delays is correct, then a correctly calibrated cancellation system also reduces intermodulation distortion as the cancellation method also introduces intermodulation distortion of the correct phase and amplitude since it uses the same polynomial mechanism.

In practice it is unlikely that a polynomial distortion model is the only mechanism. Other mechanisms may generate a particular harmonic, so calibration for cancellation of harmonics with single sine-wave inputs may not handle intermodulation distortion correctly in the general case. The only way to correctly cancel intermodulation distortion in all cases is if the structure of the distorting circuit is understood in great detail. Once the nature of the distortions is known, then equivalent delays/filters/multiplications may be structured to produce "antiharmonics" in an equivalent manner to the distorting circuit. Subtraction to cancel the harmonics then works over a much wider range of input conditions.

Unfortunately the designers of an ADC may not understand all the distortion mechanisms—although they attempt to eliminate the major sources of distortion. As the remaining distortions are often at a very low level, measuring them accurately is difficult. The problem with the prior proposed solutions is that each harmonic cancellation system generates lower order harmonics which may be larger than the corrected value and have to be removed in lower order harmonic correction.

What is desired is a new approach to general harmonic distortion correction to provide linearity correction, especially for multi-stage ADCs.

BRIEF SUMMARY OF THE INVENTION

Accordingly the present invention provides linearity compensation by harmonic cancellation by generating a separate harmonic correction component for each harmonic of a fundamental frequency of the input signal within a frequency range of interest. The harmonic correction components are summed with a delayed version of the input signal to produce a corrected input signal for input to the non-linear system. The separate harmonic correction components are generated by respective harmonic correction units, each having a programmable input filter, a Hilbert Transformer filter and a plurality of phase shifters. The input signal passes through the programmable input filter first, which is usually a finite impulse response (FIR) filter, to the input of the Hilbert Transformer filter and to a compensating delay. The output from the Hilbert Transformer filter and a delayed version of the filtered input signal from the compensating delay are input to parellel phase shifters, and the respective outputs from the phase shifters are multiplied together to produce the separate harmonic correction components for each harmonic correction unit.

The objects, advantages and other novel features of the present invention are apparent from the following detailed description when read in conjunction with the appended claims and attached drawing.

DETAILED DESCRIPTION OF THE INVENTION

Self-modulating harmonic distortion mechanisms are based on the formation of a product of delayed versions of an input signal within a nonlinear system, such as a multi-stage ADC. It is difficult to infer the delays on each path of the input signal to this system. In the special case where they have the same phase, the above-described harmonic profile of the prior art is appropriate. In actual systems any combination of phases is possible. In another particular case a set of evenly spaced phase relationships produce only the desired harmonic. This has the advantage that each harmonic may be independently calibrated for cancellation. The disadvantage is that some additional processing is involved.

The present invention uses the following product over evenly spaced phase shifts on the assumption that delays map to phase shifts if the sample clock rate is not changed between calibration and operation:

$$\sin(n,\omega t)=2^{n-1}\Pi_{k=0\to n-1}\sin(\omega t+k\pi/n)$$

Using a trigonometric expansion, this becomes:

$$\sin(n,\omega t)=2^{n-1}\Pi_{k=0\to n-1}(\sin(\omega t)\cos(k\pi/n)+\cos(\omega t)\sin(k\pi/n))$$

For an input $f(t)=\sin(\omega t)$ the $\cos(\omega t)$ is generated using a Hilbert Transformer H( ) filter. The Hilbert Transformer filter is effectively able to phase shift by $\pi/2$ to all input frequencies with a target accuracy in its designed input frequency range. It does not work for all possible input frequencies, as the filter must then be infinitely long. The Hilbert Transformer filter is usually implemented as a finite impulse response (FIR) filter, so it is linear and can simultaneously phase shift all frequencies on its input by $\pi/2$. For an input f(t) the above equation is generalized for any input to generate the $n^{th}$ harmonic output:

$$Hm(n,f(t))=2^{n-1}\Pi_{k=0\to n-1}(f(t)\cos(k\pi/n)+H(f(t))\sin(k\pi/n))$$

This product may be implemented with a single Hilbert Transformer filter, as Hilbert Transformer filter output H(f(t)) is independent of the product loop variable k. In practice the input filtered f(t) signal is delayed to match the delay through the Hilbert Transformer filter. The coefficients $\cos(k\pi/n)$ and $\sin(k\pi/n)$ scale each of the f(t) and H(f(t)) differently for all the values of k, and are added to produce the terms in the product. The terms are all then multiplied, using n−1 multiplications, to obtain the harmonic correction output.

Figure 1:
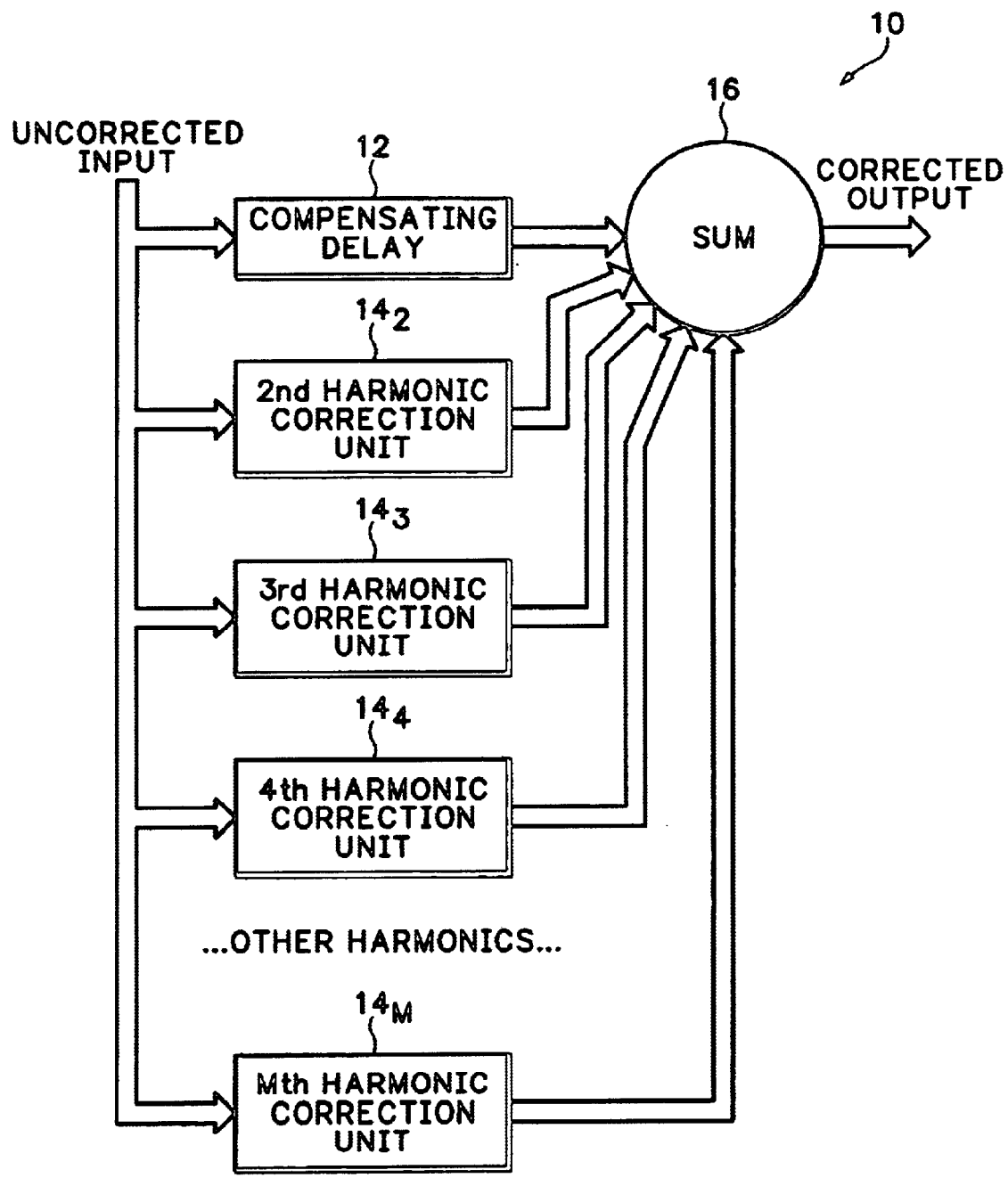
FIG. 1 is a top-level block diagram view for a linearity compensation system according to the present invention.

Such a compensation system 10 is shown in FIG. 1 where an input signal $f(t)=\sin(\omega t)$ is input to a compensating delay circuit 12 and respective harmonic correction units $14_{2-M}$. The outputs from the individual harmonic correction units $14_{2-M}$ and the compensating delay circuit 12 are then input to a summer 16 to produce a harmonic corrected signal.

Looking at an example, the harmonic generator made up of the harmonic correction units $14_{2-M}$ for n=3 has the following expansion into three product terms:

$$Hm(3,f(t))=4(f(t)\cos(0)+H(f(t))\sin(0))(f(t)\cos(\pi/3)+H(f(t))\sin(\pi/3))(f(t)\cos(2\pi/3)+H(f(t))\sin(2\pi/3))$$

The sin( ) and cos( ) terms may be evaluated, simplifying to:

$$Hm(3,f(t))=4f(t)(f(t)/2+\operatorname{sqrt}(3)H(f(t))/2)(-f(t)/2+\operatorname{sqrt}(3)H(f(t))/2)$$

which further simplifies to:

$$Hm(3,f(t))=f(t)(3H(f(t))^2-f(t)^2)$$

To show that this result generates a $3^{rd}$ harmonic, the input is set to a single sine wave at angular frequency $\omega$:

$$f(t)=\sin(\omega t)$$

and if the Hilbert Transformer filter converts $\sin(\omega t)$ to $\cos(\omega t)$, then:

$$H(f(t))=\cos(\omega t)$$

The following well-known multi-angle expansions define harmonics in terms of powers of the fundamental:

$$\sin(nx)=\Sigma_{k=0\to\lfloor(n-1)/2\rfloor}(n,2k+1)(-1)^k\cos(x)^{n-1-2k}\sin(x)^{2k+1}\cos(nx)=\Sigma_{k=0\to\lfloor n/2\rfloor}(n,2k)(-1)^k\cos(x)^{n-2k}\sin(x)^{2k}$$

$y=\lfloor X \rfloor$ is the "floor" function, returning the greatest integer $y \leq x$. Evaluating the above for n=3:

$$Hm(3,\sin(\omega t))=\sin(3\omega t)$$

This yields the third harmonic angular frequency $3\omega$, and no other harmonics, directly from the angular frequency $\omega$. This type of distortion may occur as part of a decomposition of non-linearities into polynomials, as discussed above, or through self-modulation mechanisms.

Similar expansions yield structures or algorithms for generating any harmonic from a sinusoidal input. As with using powers, harmonics are correctly aliased in sampled systems. As with the polynomial system described above, a filter is placed at the input to each harmonic generator, allowing independent calibration of the amplitude and delay of each harmonic as a function of input frequency.

Figure 2:
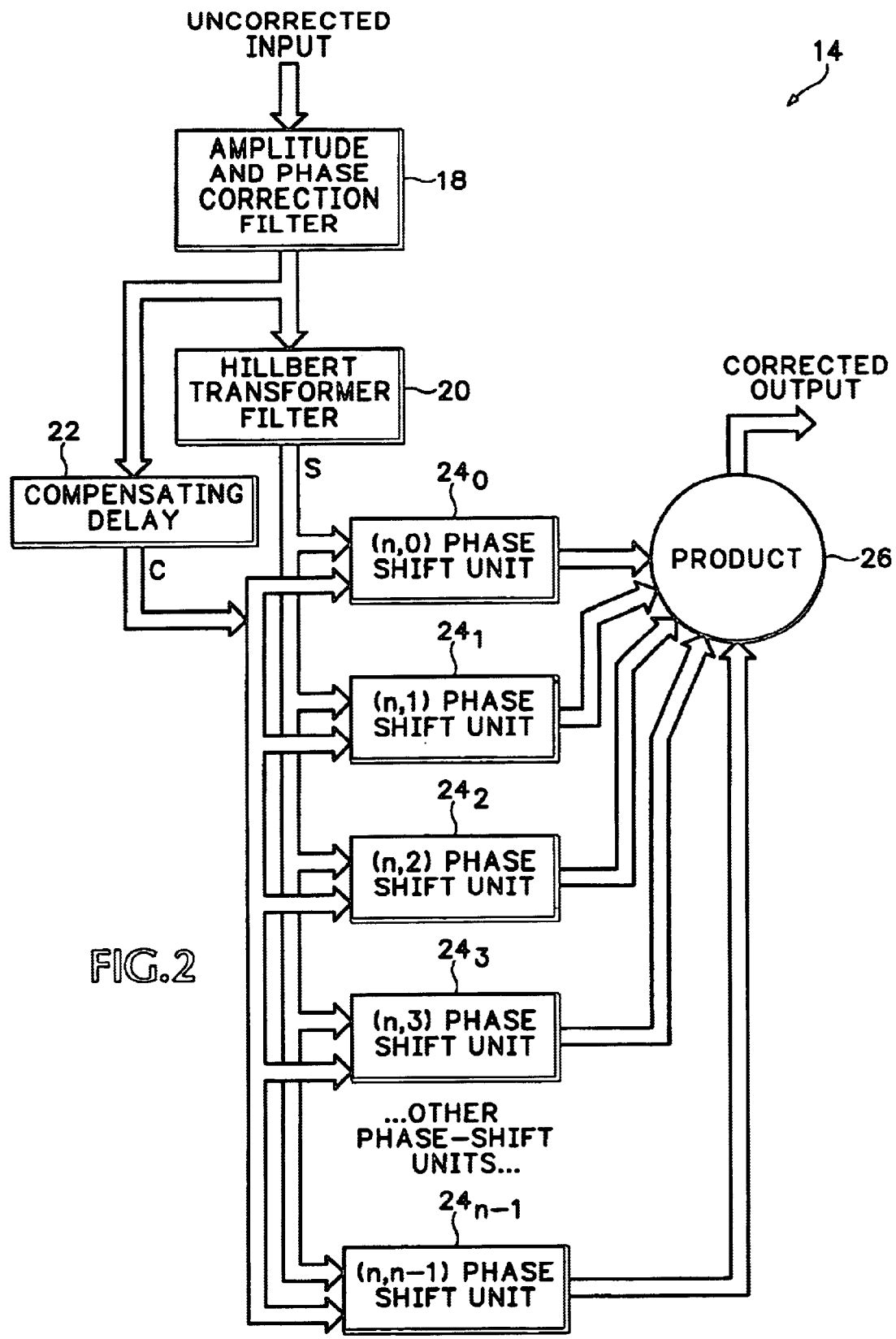
FIG. 2 is a block diagram view of a harmonic correction unit for the linearity compensation system according to the present invention.

Referring now to FIG. 2 a harmonic correction unit 14 has an input amplitude and phase correction filter 18 followed by a Hilbert Transformer filter 20 and in parallel another compensating delay circuit 22 to produce S and C (sin and cos) signals that are input in parallel to subsequent phase shift units $24_{0-(n-1)}$. The outputs of the phase shift units $24_{0-(n-1)}$ are provided as harmonic corrected outputs to a multiplier 26, the output of which is the output from the harmonic correction unit 14 that is input to the summer 16.

Figure 3:
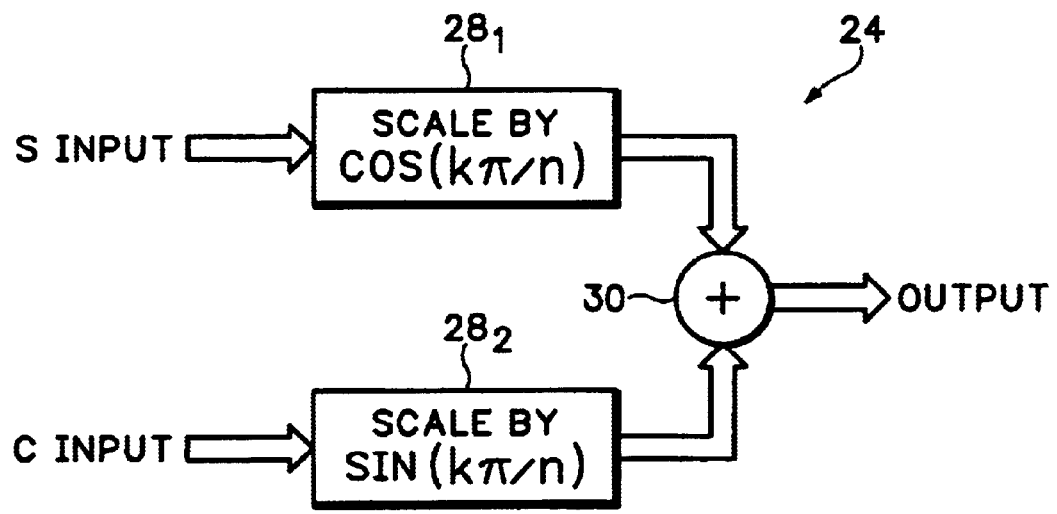
FIG. 3 is a block diagram view of a phase shift unit for the linearity compensation system according to the present invention.

As shown in FIG. 3 each phase shift unit 24 receives the S and C inputs in respective scalers $28_{1-2}$. For the S input the scale factor is $\cos(k\pi/n)$, and for the C input the scale factor is $\sin(k\pi/n)$. The scaled S and C outputs are input to phase summer 30 to provide the phase shift output from the phase shift unit 24 to the multiplier 26.

The calibration procedure is simpler than for the power-based solubon, as each harmonic is calibrated independently of the others. First the amplitude/phase compensation filters 18 are bypassed so that they do not interfere with subsequent amplitude/phase measurements. Then the calibration follows the steps below:

For each harmonic n for which non-linear distortion is to be corrected: for a set of preferably evenly-spaced calibration frequencies over a range of interest:

1) inject a sine wave of known amplitude and frequency through the non-linear system and acquire its output;
2) simultaneously feed the output of the non-linear system into the circuit shown in FIG. 2 to generate the $n^{th}$ harmonic directly, acquiring it at the same sample times as in step (1)—the distortions on the input of the circuit are themselves product distortions, but these are assumed to be very small relative to the fundamental;
3) measure the relative amplitude and phase of the $n^{th}$ harmonic generated from steps (1) and (2) through the non-linear system.

The set of amplitude and phase corrections obtained at each calibration frequency provide the parameters for correction after the distortion generating mechanism on the $n^{th}$ harmonic. To allow the filter to correct for aliased harmonics of the input, the response parameters are modified to apply to the $n^{th}$ harmonic amplitude/phase compensation filter 18 before its distortion generator:

4) convert each relative phase shift into delay (delay= phase/angular_frequency) to accommodate moving the filter in front of the harmonic generator;
5) take the $n^{th}$ root of the relative amplitude response at each frequency;
6) calibrate the digital input filter from the delay and amplitude values obtained in steps (4) and (5)— generally the filter is an asymmetric filter with non-linear phase, so one design approach is to use an iterative FFT algorithm with relaxed constraints outside of the input frequency band of interest, hence the preference for regularly spaced calibration frequencies;
7) program the amplitude/phase compensation filter 18 for the $n^{th}$ harmonic from step (6) and configure the generated harmonic to subtract it from the delayed input, providing the required $n^{th}$ harmonic cancellation;
8) run the cancellation system 10 to cancel harmonics.

Thus the present invention provides linearity compensation using harmonic cancellation by generating a separate harmonic correction component for each harmonic within a frequency range of interest using Hilbert Transformer filters and phase shifting, and summing the separate harmonic correction components to provide a corrected output.

What is claimed is:

1. A linearity compensation circuit for a non-linear system that introduces harmonic distortion into an input signal comprising:

means for generating from the input signal a plurality of separate corrected harmonic components using Hilbert Transformer filters; and means for summing the plurality of separate corrected harmonic components with a delayed version of the input signal to provide a corrected input signal with harmonic cancellation of the harmonic distortion.

2. The linearity compensation circuit as recited in claim 1 wherein the generating means comprises a plurality of harmonic correction units for harmonics of a fundamental frequency of the input signal, each harmonic correction unit having the input signal as an input and the respective separate corrected harmonic component as an output.

3. The linearity compensation circuit as recited in claim 2 wherein the summing means comprises:

an input compensating delay circuit having the input signal as an input and a delayed input signal as an output, the input compensating delay circuit delaying the input signal to compensate for the processing time of the harmonic correction units; and a summer having the separate corrected harmonic components and the delayed input signal as inputs and having the corrected input signal as an output.

4. The linearity compensation circuit as recited in claim 2 wherein each harmonic correction unit comprises:

an input filter having the input signal as an input and providing an amplitude/phase corrected input signal as an output;

a Hilbert Transformer filter having the amplitude/phase corrected input signal as an input and providing a first signal as an output;

means for delaying the amplitude/phase corrected input signal to produce a second signal as an output, the delay for the delaying means being equal to the processing time of the Hilbert Transformer filter;

means for phase shifting the first and second signals to produce a desired harmonic for the harmonic correction unit, the phase shifting means providing a plurality of separate phase shifted signals; and means for multiplying the plurality of separate phase shifted signals together to produce the respective separate corrected harmonic component.

5. The linearity compensation circuit as recited in claim 4 wherein the phase shifting means comprises a plurality of phase shifting units each having as inputs the first and second signals and providing as outputs the separate phase shifted signals.

6. The linearity compensation circuit as recited in claim 5 wherein each phase shifting unit comprises:
- a first scaler having the first signal as an input and providing a scaled first signal as an output;
- a second scaler having the second signal as an input and providing a scaled second signal as an output; and
- means for summing the scaled first and second signals to produce the respective separate phase shifted signal.

7. The linearity compensation circuit as recited in claim 6 wherein scale factors for the first and second scalers are a cosine and a sine function respectively, the cosine and sine functions having the same argument which is a function of the desired harmonic for the particular harmonic correction unit.

* * * * *